(12) United States Patent
Batres et al.

(10) Patent No.: US 10,249,786 B2
(45) Date of Patent: Apr. 2, 2019

(54) THIN FILM AND SUBSTRATE-REMOVED GROUP III-NITRIDE BASED DEVICES AND METHOD

(71) Applicant: PALO ALTO RESEARCH CENTER INCORPORATED, Palo Alto, CA (US)

(72) Inventors: Max Batres, Redwood City, CA (US); Zhihong Yang, San Jose, CA (US); Thomas Wunderer, Santa Cruz, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 241 days.

(21) Appl. No.: 15/363,050

(22) Filed: Nov. 29, 2016

(65) Prior Publication Data

US 2018/0331252 A1 Nov. 15, 2018

(51) Int. Cl.
*H01L 33/00* (2010.01)
*H01L 21/02* (2006.01)
(Continued)

(52) U.S. Cl.
CPC ...... *H01L 33/0079* (2013.01); *H01L 21/0201* (2013.01); *H01L 21/0254* (2013.01); *H01L 21/02389* (2013.01); *H01L 21/02634* (2013.01); *H01L 21/30625* (2013.01); *H01L 21/7806* (2013.01); *H01L 29/2003* (2013.01); *H01L 29/32* (2013.01); *H01L 33/0075* (2013.01); *H01L 33/025* (2013.01); *H01L 33/32* (2013.01); *H01S 5/183* (2013.01); *H01S 5/32308* (2013.01); *H01S 2304/04* (2013.01)

(58) Field of Classification Search
CPC ........... H01L 33/0079; H01L 21/30625; H01L 33/32; H01L 29/2003; H01L 33/0075; H01L 21/02634
See application file for complete search history.

(56) References Cited

U.S. PATENT DOCUMENTS 7,037,838 B2    5/2006    Schowalter et al.
7,323,414 B2    1/2008    Schowalter et al.
(Continued)

FOREIGN PATENT DOCUMENTS

WO    03/043780 A2    5/2003
WO    2006/135688 A2    12/2006
WO    2008/088838 A1    7/2008

*Primary Examiner* — Bac H Au
(74) *Attorney, Agent, or Firm* — Miller Nash Graham & Dunn LLP

(57) ABSTRACT

A method of thinning a bulk aluminum nitride substrate includes providing a bulk aluminum nitride (AlN) substrate with at least one epitaxially grown group-III-nitride layer on a first side of the substrate, applying a slurry having a high pH to a second side of the substrate opposite the first side, chemical mechanically polishing the second side of the substrate using the slurry to remove at least a portion of the substrate, resulting in a thinned layer with a thickness less than 50 microns, and bonding the epitaxial layer to a non-native substrate. A device has at least one active zone in a layer of epitaxial Group-III-nitride material, the epitaxial Group-III-nitride layer having a defect density of less than or equal to $10^8/cm^2$.

14 Claims, 3 Drawing Sheets

(51) Int. Cl.
    *H01L 21/306*     (2006.01)
    *H01L 21/78*     (2006.01)
    *H01L 29/20*     (2006.01)
    *H01L 29/32*     (2006.01)
    *H01L 33/02*     (2010.01)
    *H01L 33/32*     (2010.01)
    *H01S 5/183*     (2006.01)
    *H01S 5/323*     (2006.01)

(56) References Cited

U.S. PATENT DOCUMENTS

| | | | |
|---|---|---|---|
| 7,728,348 B2 * | 6/2010 | Kasai | H01L 21/187 257/101 |
| 7,732,301 B1 * | 6/2010 | Pinnington | H01L 21/2654 438/455 |
| 8,866,149 B2 * | 10/2014 | Holder | H01L 29/003 257/76 |
| 2010/0062601 A1 | 3/2010 | Moeggenborg | |
| 2011/0117726 A1 * | 5/2011 | Pinnington | H01L 21/02389 438/458 |
| 2014/0103353 A1 * | 4/2014 | Ishibashi | H01L 21/2007 257/76 |
| 2014/0209923 A1 | 7/2014 | Xie et al. | |
| 2015/0380496 A1 * | 12/2015 | Ishibashi | H01L 33/32 257/615 |

\* cited by examiner

THIN FILM AND SUBSTRATE-REMOVED GROUP III-NITRIDE BASED DEVICES AND METHOD

STATEMENT REGARDING FEDERALLY SPONSORED RESEARCH AND DEVELOPMENT

This invention was made with Government support under HR0011-15-C-0025 DARPA-LUSTER-UVCLaserDiod awarded by DARPA. The Government has certain rights in this invention.

FIELD OF THE INVENTION

This disclosure relates to devices having an extremely thinned substrate or with the substrate removed, more particularly to aluminum nitride substrates.

BACKGROUND

Aluminum nitride (AlN) and AlN epitaxial films grown on bulk AlN substrates have several uses due to the unique properties of the AlN material system—particularly its very high band gap energy. In some instances, the substrate may need to undergo extreme thinning, such as to less than 20 microns, or be completely removed. One such example consists of a UV-C VECSEL (vertical external cavity surface emitter laser) device emitting near 240 nm. The term 'bulk AlN' refers to AlN single crystalline AlN boules that are sectioned into wafers on which epitaxial material is grown.

Vertical lasers rely on light traversing the laser cavity multiple times. This requires that the reflectors be highly efficient, and that the cavity have very low absorption. At UV-C wavelengths, bulk AlN substrates exhibit absorption loss to the degree that even a micron of substrate material in the cavity would inhibit the gain necessary for successful lasing. Removing the substrate, leaving only higher quality epitaxial material in the cavity, becomes an essential process and device structure. Thin film ergodic LED devices represent another example where light must traverse a low loss cavity multiple times. Substrate removal can also provide benefits to electronic devices. In addition, substrate-removed devices may be fused or bonded onto substrates with superior properties to the one upon which they were formed. Substrate thinning or complete removal and subsequent bonding or fusion can enable devices that require a thin channel in contact with a contrasting material, such as semiconductor on insulator (SOI) and radio frequency devices.

For class III-V semiconductor devices substrate removal is typically employed for devices grown heteroepitaxially on non-native substrates. In this case, the substrate removal processes typically exploit material differences that exist between the substrate and epitaxial layers to remove the substrate while maintaining the device layers intact.

For example, a laser lift-off process can remove gallium nitride (GaN) blue LED device layers grown on sapphire. The laser employs a wavelength transparent in sapphire but absorbed by GaN. Selective ablation at the substrate/epitaxial layer interface causes the epitaxial layer to separate from the substrate. Other examples include AlGaInP LED device layers grown on red light absorbing gallium arsenide (GaAs) substrates. The substrate is removed by a chemically selective wet etch that attacks the substrate but not the device layers. Another example involves separating device layers by photo-electrochemical (PEC) undercut etching of a strategically located n-type epitaxial material layer.

SUMMARY

One embodiment is a method of thinning a bulk aluminum nitride substrate, including providing a bulk aluminum nitride (AlN) substrate with at least one epitaxially grown group-III-nitride layer on a first side of the substrate, applying a slurry having a high pH to a second side of the substrate opposite the first side, chemical mechanically polishing the second side of the substrate using the slurry to remove at least a portion of the substrate, resulting in a thinned layer with a thickness less than 50 microns, and bonding the epitaxial layer to a non-native substrate.

Another embodiment is a device including at least one active zone in a layer of epitaxial Group-III-nitride material, the epitaxial Group-III-nitride layer having a defect density of less than or equal to $10^8/cm^2$.

DETAILED DESCRIPTION OF THE EMBODIMENTS

Figure 1:
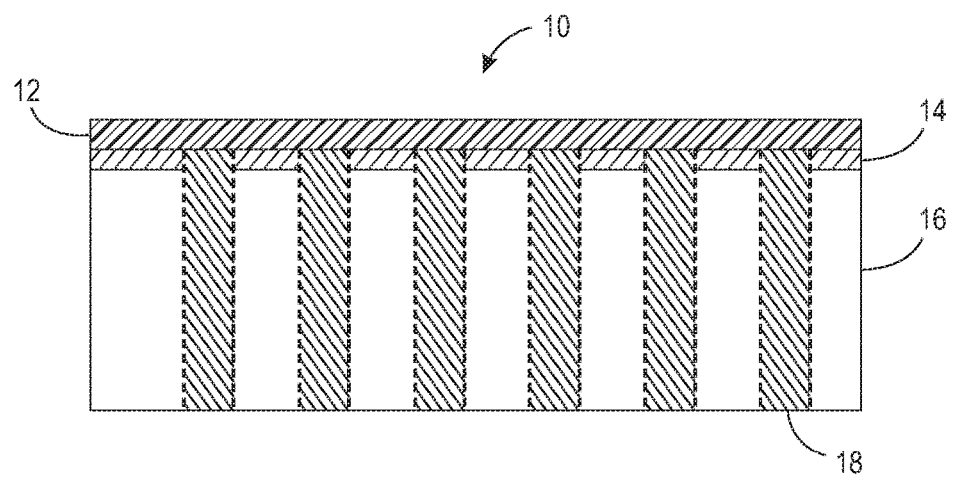
FIG. 1 shows a epitaxial AlN-based wafer on a carrier.

With recent advances in substrate growth technology, epitaxial processes can now epitaxially grow material and produce devices on 'native' substrates such as gallium nitride (GaN) and aluminum nitride (AlN). The term 'native' as used here means that the epitaxial layer consists of the same material as the substrate. The discussion may refer to the substrate as the 'bulk' substrate to differentiate it from the epitaxial layer.

The ability to epitaxially grow these materials enables highly defect-free material and new devices, many of which require substrate removal or thinning. The lack of material behavior 'contrast' between the substrate and the epitaxial layers precludes many of the methods typically employed for substrate thinning and removal. For purposes of simplifying the discussion, thinning and substrate removal will be referred to collectively as thinning the substrate.

Essentially, in the embodiments here, removing the substrate is an extension of the thinning process to the point where no substrate remains. Many of the currently available substrate removal processes do not work for epitaxially grown GaN or AlN. Specifically, photo-electro chemical etching (PEC) based approaches have been found to be ineffective for AlN substrate removal. p-type doping is currently very problematic for AlN substrates and epitaxial layers, making PEC unlikely to be an effective tool. Another approach, would use an epitaxially grown layer to form an etch stop or differentially light absorbing layer. Many devices formed in the epitaxial layer rely on the high quality gained by epitaxially growth, so etch stops or light absorbing layers with sufficiently contrasting properties are counter to this quality.

Similarly, conventional mechanical thinning, while an obvious consideration, has a low probability for success. Conventional mechanical thinning works on softer materials, such as silicon. AlN and wide band gap materials more generally, lie at the other extreme, having a high hardness.

Conventional mechanical thinning process would have to be highly aggressive to produce acceptable material removal rates. This would require large abrasive particle size and high force, which causes cracking and sub-surface damage that would extend deep into the substrate and eventually into the device layers themselves.

Experiments have shown that upon thinning substrates to a thickness of approximately 30 microns, the mechanical thinning process destroys the mechanical integrity of the sample, meaning cracking extends through the entirety of the sample, at which point it no longer adheres to the mounting chuck. This will likely limit substrate thicknesses to a value greater than 30 microns, noting that sub-surface damage will extend throughout the device layers before cracking has led to the obvious destruction of the sample. Thicknesses near 30 microns with useable device layers may be possible, but would likely require prohibitively time consuming abrasive steps with extremely low material removal rates, such as orders of magnitude lower than typical rates. Furthermore, sub-surface damage created by conventional thinning notoriously creates light absorbing regions, regardless of the final thickness reached. This absorption can severely impair device functionality for optoelectronic devices.

For these reasons, conventional abrasive based thinning is not expected to enable devices below 30 microns in thickness and cannot achieve complete substrate removal for reasonable epitaxial layer thicknesses. For devices where near perfect optical transparency is critical, mechanical thinning cannot be used at all without some sort of mitigating processes, such as damage removal etch. Evidence of the above can be found in a patent application U.S. Pat. No. 9,299,883, where 50 microns is specified as the minimum remaining thickness feasible by mechanical polishing. That patent also does not address substrate removal, a thick epitaxial layer of approximately 12 microns, nor does it address TTV, discussed at length below. The thickness of the epitaxial layer could be thinner, to match the TTV capabilities of the entire process. The patent also does not apply chemical mechanical polishing for material removal, just for smoothing a surface for epitaxial growth. A similar U.S. Pat. No. 7,323,414, also addresses mechanical polishing for smoothing a surface, but not full removal of the material. In the instances when the patent addresses chemical mechanical polishing (CMP), it is always to create a smooth epitaxial ready surfaces.

Purely chemical etching also has issues as a thinning, substrate removal process, or even damage removal method. Inserting a sufficiently thick etch stop layer with acceptable etch robustness into the epitaxial structure would relinquish the benefits that result from a epitaxially grown layer on a native substrate. Epitaxial growth has the advantage of no lattice mismatch between the substrate and the epitaxial layers, an advantage which is lost for sufficiently thick layers with substitute atoms of differing lattice parameter.

Group III-Nitride material systems have known crystallographic asymmetry and polarization fields that result in a strong tendency toward anisotropic behavior during chemical etching. As used here, group-III materials are those identified by Group 3 on the Periodic Table of the elements and include aluminum (Al), Indium (In), Gallium (Ga), Thallium (Tl), and Boron (B). When etching is carried out on the nitrogen face, which is generally the case for the conventional orientation of group III-nitride substrates, the material is seen to be highly reactive, either chemically as in the case of AlN and/or electrochemically in the case of GaN.

In sharp contrast, the group III oriented face is seen to be extremely chemically inert. This anisotropy is observed for both wet and dry etching processes. Whether the etch is wet or dry, chemical, or electrochemical, surface smoothness or planarity will not be preserved for material removal processes that lack any mechanically abrasive planarizing component. This is expected to hold true for both bulk material removal etches and clean up etches used to remove physically created damage. The implication is that a chemical process for removing damage is likely to compromise the surface flatness required for many device applications. In summary, existing methods cannot remove or thin substrates below 20 microns or give rise to other issues.

FIG. 1 shows an embodiment of a device 10 mounted on a carrier 16. The carrier 16 has perforations such as 18 in this example. The layer 12 may be mounted on the carrier 16 using a layer of adhesive 14. The layer stack 12 may contain optoelectronic device heterostructures or a device that relies upon a very thin substrate, or upon the substrate being completely removed. As discussed above, these device heterostructures may consist of vertical external cavity surface emitter lasers (VECSELs), distributed Bragg reflectors (DBRs), thin film ergodic LEDs, silicon on insulator (SOI), radio frequency devices, etc.

Examples of devices that require substrate thinning or removal include UV-C (UV light having a wavelength in the 100-280 nanometer range) VECSELs, mentioned before, and UV-C LEDs. Very simply, a VECSEL is a laser device in which the charge carriers are injected by means of an electron beam originating relatively far from the laser cavity, both of which are contained in a vacuum. The laser cavity consists of layers of AlN and AlGaN alloys with specific composition and structure so as to generate the necessary conditions for lasing. As lasing requires stimulated emission, a high photon flux through the active region is necessary. In effect this means that generated photons traverse the cavity many times, necessitating high reflectance from either side of the cavity, and extremely low absorption within the cavity. This last constraint requires the removal of the substrate.

The bulk material, despite having low defect density, still has impurity dopant/defect concentrations that cause the material to be absorbing at UV-C wavelengths. Even a single micron of bulk substrate material remaining would result in catastrophic absorption levels, given the multiple passes through the material making up the cavity. Because the growth method for the epitaxial layers here is MOVPE (metal organic vapor phase epitaxy), the process does not incorporate these levels of dopants/defects resulting in a material comparably transparent even at UV-C wavelengths. There are other relevant aspects to this device. For instance, the epitaxial layers need to be fused to a thermal heat sink substrate such as diamond. The highly planar, smooth, and damage free surface produced by the methods here enable this wafer fusion process.

Another example consists of a UV-C LED, whether powered externally by e-beam pumping in vacuum or by conventional electrical injection in a p-/n-junction diode. One common LED chip design is the so-called 'thin-chip' or 'thin-film flip-chip' design. Cell phone camera flashes typically employ this design, for example. The design works by having a cavity, where instead of mode minimized coherence, its opposite, ergodicity, is obtain. In this approach, light not 'extracted' from the high index crystal layers reflects in a randomized, mostly loss free, manner until it arrives at a trajectory that allows it to escape to the outside world. Therefore, the cavity should be highly transparent. In addition, approaches to LEDs exist that involve fusing the epitaxial layers to a second substrate material that has desirable light extracting, thermal, and or mechanical properties. This approach also would benefit from fusion to a smooth substrate free epitaxial layer.

Figure 2:
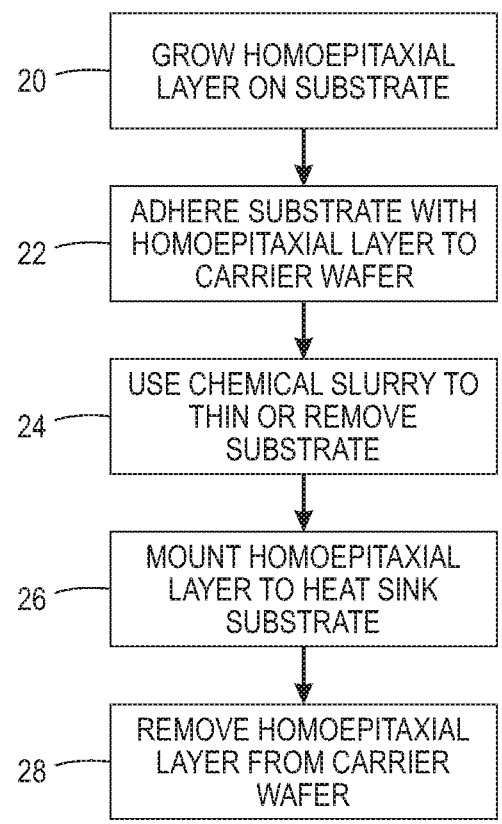
FIG. 2 shows a flowchart of one embodiment of a method of thinning an AlN substrate.
Figure 3:
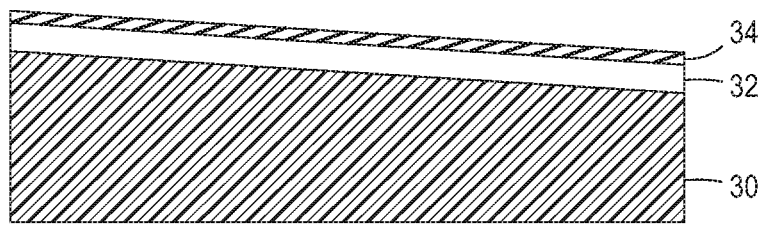
FIGS. 3-5 show various stages of a device undergoing manufacture.
Figure 4:
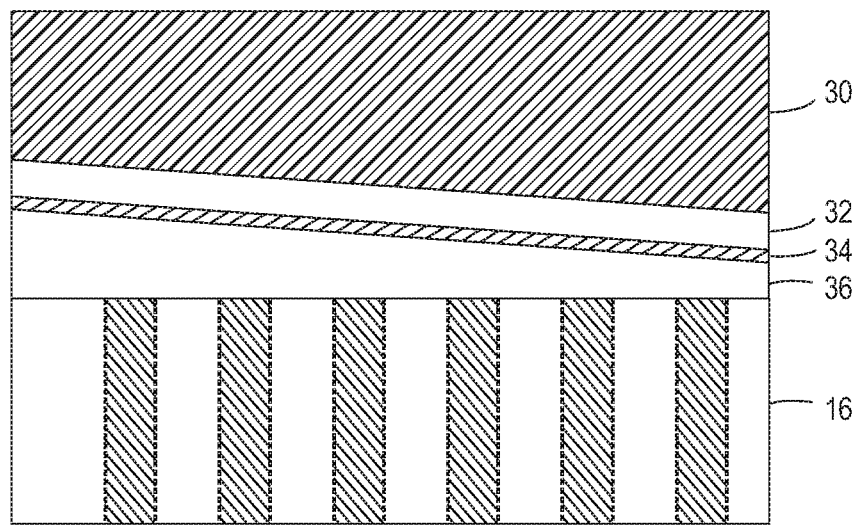
Figure 5:

Turning now to FIG. 2, the discussion turns to the formation of the device. FIG. 2 will be discussed with regard to FIGS. 3-5 showing the stages of manufacture. In one embodiment, the process starts at 20 in FIG. 2 by growing an epitaxial layer 32 on a bulk AlN substrate 30 in FIG. 3. The epitaxial layer may contain optoelectronic or other types of electronic devices in at least a portion or zone 34 of the epitaxial layer. The region 32 identifies a portion of the epitaxial layer that protects the layer 34 from being removed or thinned. The combination of the bulk AlN substrate and the epitaxial layer will be referred to here as the composite substrate.

The process next adheres the composite substrate to a carrier wafer in 22 of FIG. 2. In this embodiment, a perforated sapphire substrate 16 receives a spin coated adhesive 36 in FIG. 4. The composite substrate of the substrate 30, and epitaxial layers 32 and 34 is then mounted on the carrier to provide mechanical support during chemical mechanical planarization. Note that the composite substrate is rotated to be 'upside down.'

The CMP process applied at 24 in FIG. 2 may take many forms. In one embodiment, a soft polishing pad applies a relatively high pH slurry having abrasive particles to the bulk MN substrate. As used here, a 'high pH' slurry consists of a slurry having a pH in the base range of about 9.5 or higher. In one embodiment, the slurry consists of a colloidal silica having a pH of 9.8. The particle size may vary, but in some embodiments they have a size ranging from 0.02 microns to 0.05 microns. Smaller particle sizes result in slower material removal rates (MRR), but may reduce the chance of any defects being caused by the process and result in greater surface smoothness.

The resulting device heterostructures may only consist of the device layer 34 and portions of 32. After this point, the epitaxial layer can be transferred from the carrier substrate and, for example, bonded to a heat sink such as diamond, mentioned above and shown at 26 in FIG. 2. The carrier wafer is then removed at 28, leaving only the portion 34 and 32 of the epitaxial layer adhered to the heat sink substrate 40 by means of a direct bond. The direct bonding process may involve surface treatments, interlayer depositions, pressure, and/or heat to cause the material of the epitaxial layer to bond to the heat sink without using any adhesives. However, adhesive bonding, metal-metal bonding, metal eutectic bonding, and anodic bonding may also have advantages depending upon the application. The epitaxial layer may also be bonded to a different non-native substrate, other than the heat sink, where a non-native substrate is any substrate that is not the substrate upon which it was created.

In addition to the damage free and high material removal rate discussed above, the substrate removal or extreme substrate thinning process requires very stringent planarity control of the entire substrate, adhesive, and carrier wafer stack. Planarity is commonly expressed as total thickness variation (TTV) and represents the numerical thickness difference between the thickest and thinnest portions of the wafer or sample stack.

It should be noted that the epitaxial layers such as 32 and 34 are typically of the order of a few microns, whereas the substrate 30 is typically hundreds of microns. The carrier wafer 16 as well is typically several hundreds of microns or even over 1 mm thick. An adhesive layer such as 36 is typically in the microns or tens of microns range. The summation of all these layers yields the TTV of the entire stack.

It should be noted that the epitaxial device layers are hundreds of times thinner than the substrate, carrier, and adhesive stack. If the TTV of the entire stack is greater than the thickness of the epitaxial device layers, the device layers will be removed entirely at the thickest portion of the stack, whereas substrate material will remain at the thinnest portion of the stack. In addition, the material removal process introduces additional deviation from planarity, such as due to axial aparallelism of polishing equipment components. Given these considerations, great attention is required to maintaining low TTV in the epi/substrate/adhesive/carrier stack. Despite best efforts, some non-zero TTV is unavoidable.

For example, in FIGS. 3 and 4, one can see the variation of the top of the substrate reflected in the epitaxial layer 32 and portion 34. At the bonding step, where the substrate wafer and epitaxial layer is attached to the carrier wafer, a high degree of planarity is achieved through best practices. This planarity constraint between the carrier backside and the substrate backside carries through the adhesive 36, which alleviates some of the thickness variation by 'absorbing' the difference. In the final mounted layers 30 and 32, there is still some variation.

Growing a thicker epitaxial layer allows for an expanded TTV allowance. Generally, if the epitaxial layer is greater than a particular thickness, all the substrate can safely be removed while not risking total removal of the epitaxial layer where the total thickness of the stack is high. The particular thickness may depend upon the total thickness variation obtainable by the thinning and polishing processes used. For example, in some experiments if the epitaxial layer is greater than 12 microns thick, the entire substrate may be removed with the entire device layer remaining. If the epitaxial layer is less than 12 microns thick, to prevent potentially catastrophic 'punch through' during thinning, some of the substrate may be unavoidably retained for typical TTV values and CMP methods employed. Growing thick epitaxial layers with beneficial properties such as low light absorption represents another important aspect of the invention.

The resulting device, in the case where the entire substrate has been removed, may appear to be very similar in structure to devices grown using heteroepitaxy, since the relationship between the layers and the substrate is no longer relevant, and the process of how the layer came into existence is not detectable from the layer itself. However, the level of defects, define here as threading dislocations, in pseudomorphically grown epitaxial films lies far below the level of defects grown on a non-native substrate. One should note that the reference to pseudomorphic ally grown epitaxial films used here is a characteristic of the layer, not a reference to the process by which it is made. In many of the embodiments here, the pseudomorphically grown epitaxial films typically have a threading dislocation density below $10^8/cm^2$, and can be as low as $10^3/cm^2$ to $10^5/cm^2$.

Psuedomorphic growth refers to the process whereby a thin layer of material differing in composition from the underlying substrate, often alloys of the substrate, are grown in a strained state such that the otherwise different lattice parameter matches that of the substrate. Threading dislocations are a class of defects, typically resulting from lattice mismatch between the substrate and epitaxial films, known to lead to light output efficiency reducing non-radiative carrier recombination.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method of thinning a bulk aluminum nitride substrate, comprising:
   providing a bulk aluminum nitride (AlN) substrate with at least one epitaxially grown group-III-nitride layer on a first side of the substrate;
   applying a slurry having a high pH to a second side of the substrate opposite the first side;
   chemical mechanically polishing the second side of the substrate using the slurry to remove at least a portion of the substrate, resulting in a thinned layer with a thickness less than 50 microns; and
   bonding the epitaxial layer to a non-native substrate.

2. The method of claim 1, wherein the slurry has a pH in the base range.

3. The method of claim 1, wherein the slurry includes abrasive particles.

4. The method of claim 1, wherein polishing the second side of the substrate comprises to remove at least a portion of the substrate comprises removing the entire substrate.

5. The method of claim 1, wherein providing the substrate with at least one epitaxially grown group-III-nitride layer comprises providing the substrate with at least one epitaxially grown group-III-nitride layer having a threading dislocation density in a range of less than $10^8/cm^2$.

6. The method of claim 1, wherein providing the substrate with at least one epitaxially grown Group-III-nitride layer comprises growing the epitaxial Group-III-nitride layer to a thickness dependent upon a total thickness variation obtainable by bonding, thinning and polishing.

7. The method of claim 1, wherein providing the substrate with at least one epitaxially grown Group-III-nitride layer comprises growing the epitaxial Group-III-nitride layer to a thickness of at least 10 microns.

8. The method of claim 1, further comprising forming at least one light emitting heterostructure in the epitaxial layer.

9. The method of claim 1, further comprising bonding the substrate to a carrier prior to applying the slurry.

10. The method of claim 9, further comprising debonding the epitaxial Group-III-nitride layer from the carrier after the polishing.

11. The method of claim 1, wherein bonding the epitaxial Group-III-nitride layer to a non-native substrate comprises at least one of direct bonding, surface treatments, interlayer deposition, pressure bonding, heat bonding, adhesive bonding, metal eutectic bonding, metal-metal bonding, and anodic bonding.

12. The method of claim 1, wherein polishing the second side of the substrate comprises polishing the substrate to remove the entire substrate.

13. The method of claim 1, wherein polishing the second side of the substrate comprises polishing the substrate to thin the substrate.

14. The method of claim 1, wherein the thinned layer comprises one of a thinned epitaxial layer, or a thinned layer consisting of the epitaxial layer and the substrate.

* * * * *